United States Patent [19]

Seiichiro

[11] Patent Number: 4,753,258

[45] Date of Patent: Jun. 28, 1988

[54] TREATMENT BASIN FOR SEMICONDUCTOR MATERIAL

[76] Inventor: Aigo Seiichiro, 3-15-13, Negishi, Daito-ku, Tokyo, Japan

[21] Appl. No.: 762,789

[22] Filed: Aug. 6, 1985

[51] Int. Cl.$^4$ .............................................. B08B 3/04
[52] U.S. Cl. ................................. 134/186; 134/198; 134/99
[58] Field of Search ............... 134/138, 175, 177, 180, 134/182, 184, 185, 186, 190, 193, 195, 199, 34, 147, 148, 89, 88, 99, 101, 155, 36, 108; 68/207, 184, 181 R

[56] References Cited

U.S. PATENT DOCUMENTS

| 654,647 | 7/1900 | Koppelmann | 68/181 R X |
|---|---|---|---|
| 667,020 | 1/1901 | Kenyon | 134/198 |
| 726,016 | 4/1903 | Blanchard | 134/155 X |
| 2,191,799 | 2/1940 | McKenna | 134/199 UX |
| 2,957,332 | 10/1960 | Coop | 68/181 R X |
| 3,123,084 | 3/1964 | Tardoskegyi | 134/182 |
| 3,635,143 | 1/1972 | Tally | 134/155 |
| 4,092,176 | 3/1978 | Kozai et al. | 134/186 |
| 4,361,163 | 11/1982 | Aigo | 134/199 |
| 4,519,846 | 5/1985 | Aigo | 134/34 |
| 4,557,785 | 12/1985 | Onkuma | 134/198 X |
| 4,599,966 | 7/1986 | Lymn | 134/199 X |

FOREIGN PATENT DOCUMENTS

| 58-48423 | 3/1983 | Japan | 134/34 |
|---|---|---|---|
| 58-71629 | 4/1983 | Japan | 134/34 |
| 58-71630 | 4/1983 | Japan | 134/34 |

OTHER PUBLICATIONS

IBM Tech. Disclosure Bulletin, vol. 13, No. 8, Jan. 1971, G. E. Melvin et al.

Primary Examiner—Harvey C. Hornsby
Assistant Examiner—Frankie L. Stinson
Attorney, Agent, or Firm—Wegner & Bretschneider

[57] ABSTRACT

This disclosure includes an improvement relating to a square basin for applying a treatment such as etching, development, plating or washing to surfaces of semiconductor materials housed in a carrier which is supported in the basin, by a treatment liquid introduced upwardly through a passage formed in the bottom portion of the basin and then overflown at a top periphery of the basin. The improvement exists in the formation of two rows of holes in the bottom portion of the basin. These holes are adapted to discharge a treatment liquid in an inward-upward direction so as to cause a up and down swirling in the treatment liquid in the basin. This obviates local or partial stagnations of treatment liquid in the basin and effects a treatment.

4 Claims, 3 Drawing Sheets

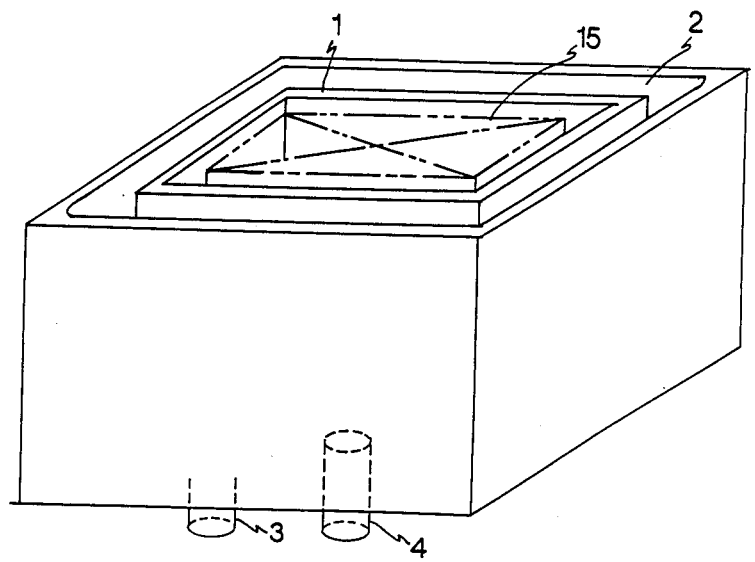
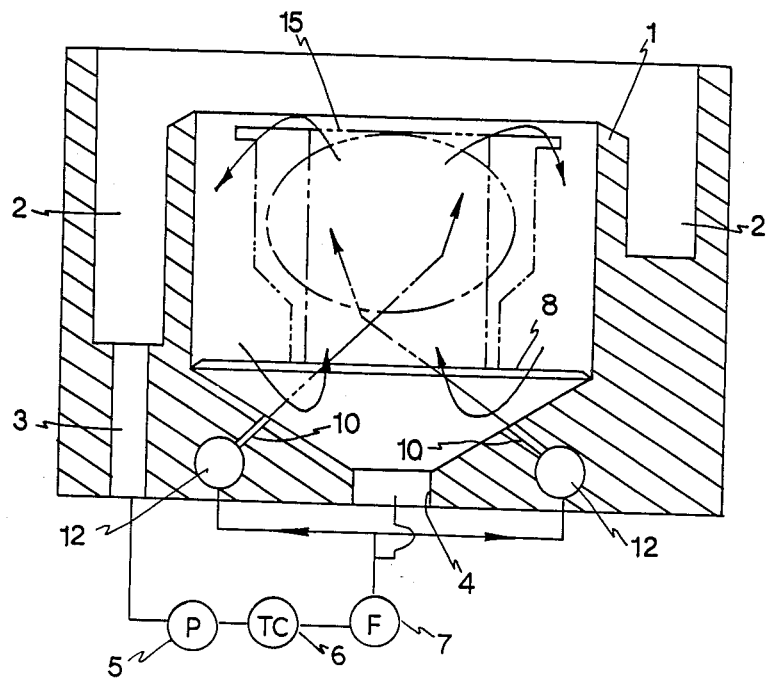

TREATMENT BASIN FOR SEMICONDUCTOR MATERIAL

BACKGROUND OF THE INVENTION

1. Field of the Invention

This invention relates an apparatus for applying a treatment to semiconductor materials such as silicon wafer or glass photomask, and more specifically to a square basin for applying a treatment such as etching, development, plating or washing to surfaces of semiconductor materials housed in a carrier.

2. Description of the Prior Art

In a commonly accepted technique, a basin of the above sort is shaped square for receiving therein an essentially square carrier for semiconductor materials, and is provided at a bottom portion thereof with a passage for introducing a treatment liquid thereinto. A gutter is located on an outer portion of the top periphery of the basin to receive overflown treatment liquid. Treatment liquid introduced through the passage in the bottom is overflown a top periphery of the basin, and then received in the gutter. The thus-received treatment liquid is again sent to the introduction passage through a circulating passage including a pump, so as to circulate the treatment liquid. Semiconductor materials housed in a carrier supported in a basin are treated with thus-circulating treatment liquid.

Since a treatment liquid is introduced upwardly through the bottom passage of a basin and then overflown top periphery of the basin, treatment liquid flows actively in the central and upper zones in the basin, while in the peripheral and lower zones in the basin it flows weakly and local stagnations will be caused. These provide inequal contact of semiconductor surfaces with the treatment liquid, which results in inequal treatment.

SUMMARY OF THE INVENTION

Therefore, an object of the present invention is to provide an improved treatment basin for semiconductor materials in which a treatment liquid flows throughout the whole interior of the basin so as to effect an uniform treatment.

In an aspect of this invention, there is provided a square basin for applying a treatment such as etching, development, plating or washing to surfaces of semiconductor materials housed in a carrier which is supported in the basin, by a treatment liquid introduced upwardly through a passage formed in the bottom portion of the basin and then overflown a top periphery of the basin. This basin is provided with two rows of holes else than said passage in the bottom portion of the basin so as to discharge a treatment liquid in an inward-upward direction, to thereby cause an up and down swirling in the treatment liquid. The swirling obviates any stagnations and promotes the flow of treatment liquid.

The above and other objects, features and advantages of the present invention will become apparent from the following description and the appended claims, taken in conjunction with the accompanying drawings.

BRIEF DESCRIPTION OF THE DRAWINGS

FIG. 1 is a perspective view of a treatment basin embodying the present invention;

FIG. 2 is a vertical cross-sectional view of the treatment basin taken along line A—A in FIG. 3;

DETAILED DESCRIPTION OF THE INVENTION AND PREFERRED EMBODIMENTS

Figure 3:
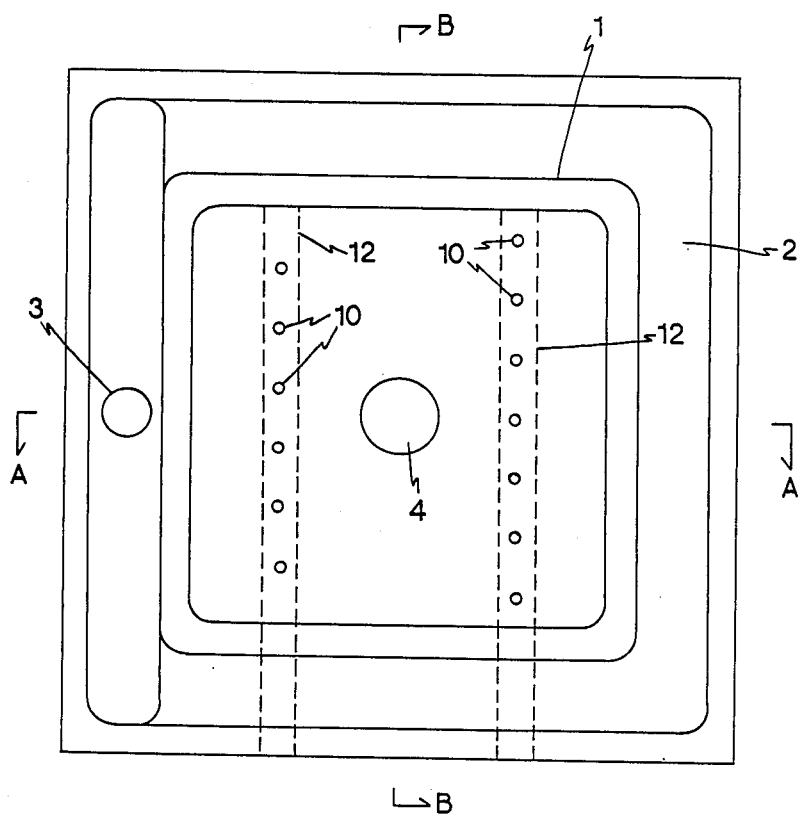
FIG. 3 is a plan view of the treatment basin.
Figure 4:
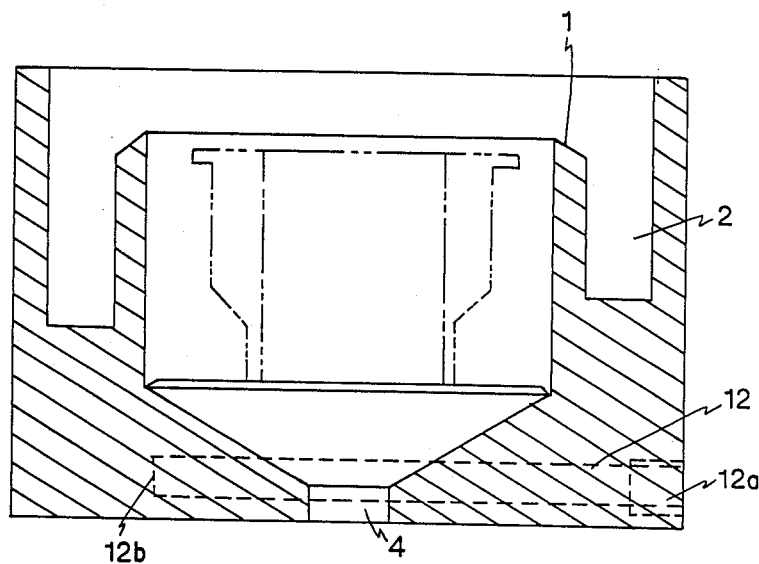
FIG. 4 is a vertical cross-sectional view taken along line B—B in FIG. 3.

Preferred embodiments of this invention will hereinafter be described with reference to the accompanying drawings. This treatment basin comprises a square basin 1 as shown in Figures for receiving an essentially square carrier 15 for semiconductor materials, and a gutter 2 is provided on outer periphery of the basin 1. In the shown embodiment, the top of the basin 1 is of a double-peripheral form, the intermediate portion thereof serves as the gutter 2. A discharge 3 is provided in a suitable position of gutter 2, and the gutter 2 will slope down to the discharge line 3. Basin 1 has at the bottom thereof a passage 4 for introducing a treatment liquid. Preferably, the bottom surface of basin 1 is sloped down to the center thereof, and the passage 4 will be positioned in the center. Such basin 1 will be formed of synthetic resin, preferably of fluororesin.

In order to circulate a treatment liquid through the basin 1, there are provided a pump 5, a temperature controller 6 and a filter 7, as shown in FIG. 2. Needless to say, water will be used as a treatment liquid. Numeral 8 denotes a support member for a carrier.

The feature of the treatment basin comprises of two rows of holes 10 formed in the bottom portion of basin 1, as shown in FIG. 3 apparently. These holes 10 are of a simple hole, and in case of circular hole, its diameter is about 0.5–2.0 mm. Also, as shown in FIG. 2, each hole 10 is inwardly, upwardly slant to discharge therethrough a treatment liquid in an inward-upward direction. The hole rows are opposed each other, the passage 4 being positioned between the hole rows. Preferably, passage 4 is formed in the center of the bottom of basin 1 and the hole rows are symmetrically disposed with respect to the centrally formed passage 4.

Furthermore, the rows of hole 10 are desirably parallel each other and as shown in FIG. 3, the holes 10 in each row are equally spaced. Preferably, the holes in one row are disposed in a staggered relation with the holes in the other row.

Figure 5:
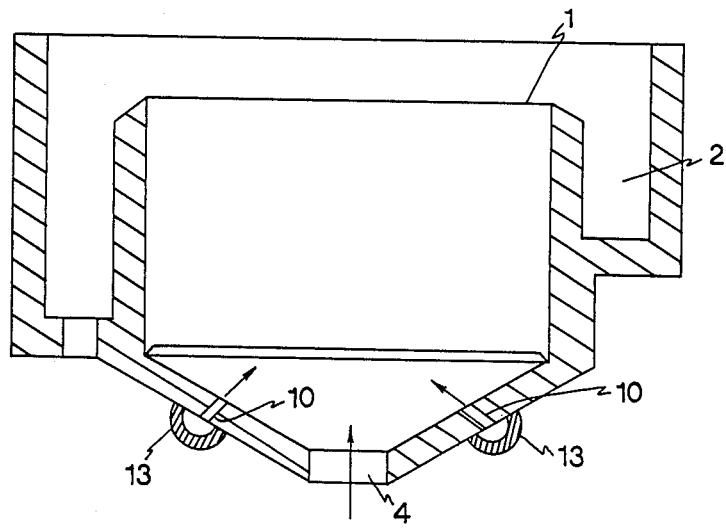
FIG. 5 is a vertical cross-sectional view showing another embodiment of the invention.

Channels 12 are provided in the bottom portion of basin 1 along the respective hole rows, and as shown in FIG. 2, each channel 12 is communicated with the relevant holes 10. Needless to say, the channels 12 are on opposite sides of the passage 4 which introduces a treatment liquid. These channels will be formed in the bottom wall of basin 1 as shown in FIG. 2. Otherwise, as shown in FIG. 5, each channel 12 will be comprised of a half cylindrical body 13 integrally with or adhered to the lower surface of the bottom portion of basin 1. The respective channels 12 are connected to the delivery port of pump 5 through filter 7 and temperature controller 6. In the shown embodiment, one end 12a of each channel 12 is open, to which end a pipe or the like is connected, and other end 12b of the same is closed. Although, in case of larger basin 1, both ends of each channel 12 will be open to be connected with a pipe or the like for introducing a treatment liquid therefrom.

In operation, a treatment liquid is upwardly introduced through passage 4 and partially through the respective holes 10 into the interior of basin 1 in which a carrier including therein semiconductor materials is located. The introduced liquid in the basin 1 flows upwards and overflows over the top periphery of basin 1, then flowing down into gutter 2 and circulating ultimately to pump 5 through discharge line 3. In this case, inward-upward discharge of liquid from the holes 10, as shown in FIG. 2, generates up and down swirling in the treatment liquid in basin 1. Due to such swirling, treatment liquid moves upwards in the inside zone in basin 1, then returns from liquid surface and moves down along the inner peripheral wall. The described swirling is caused in opposite zones in the basin 1, which causes flows throughout the whole interior of basin. This stirs the liquid to thereby present any stagnation, and thus provides uniform contact of treatment liquid with semiconductor materials in the basin 1.

In order to cause an effective swirling of treatment liquid, e.g., the holes 10 having a diameter 1.0–1.6 mm will be available in case of pump delivery pressure 1 Kg/cm$^2$ and flow rate 10 L/mn. Otherwise, the holes having a diameter 0.5–1.0 mm will be used in case of pump delivery pressure 0.4 Kg/cm$^2$ and flow rate 5 L/mn.

Having now fully described the invention, it will be apparent to one of ordinary skill in the art that many changes and modifications can be made thereto without departing from the spirit or scope of the invention as set forth herein.

What is claimed is:

1. A square basin for applying a treatment such as etching, development, plating or washing to surfaces of semiconductor materials supported in a carrier having at least two leg portions, said basin comprising: a base, the surface of said base facing the treatment liquid being downwardly slanting, and four side walls, said carrier being disposed within said basin, a passage in the center of the base at the bottom of said downwardly-slanting surface for introducing treatment liquid upwardly into the basin, said liquid then overflowing the top periphery of the side walls of the basin, two essentially parallel channels integrally formed within the base of the basin, two rows of inwardly-upwardly directed straight holes of 0.5 to 2.0 mm diameter integrally formed within the base of the basin, each row connecting one of the channels to the inside of the basin, the holes in one row being in staggered relation to the holes in the other row, wherein each hole discharges a single jet of treatment liquid in an upward-inward direction into a zone between the leg portions of the carrier, to thereby cause an up and down swirling motion in the liquid.

2. A square basin as claimed in claim 1, further comprising a gutter formed around the upper periphery of the side walls to collect overflown treatment liquid.

3. A square basin as claimed in claim 2, further comprising means to pump treatment fluid from the gutter to the passage and the channels.

4. A square basin as claimed in claim 1, wherein the diameter of the passage is substantially larger than the diameter of the holes.

* * * * *

UNITED STATES PATENT AND TRADEMARK OFFICE
CERTIFICATE OF CORRECTION

PATENT NO. : 4,753,258

DATED : June 28, 1988

INVENTOR(S) : Seiichiro AIGO

It is certified that error appears in the above-identified patent and that said Letters Patent is hereby corrected as shown below:

On the title page, item [76], after "Inventor:" change "Aigo Seiichiro" to --Seiichiro Aigo--.

Signed and Sealed this

Fifteenth Day of November, 1988

Attest:

DONALD J. QUIGG

Attesting Officer

Commissioner of Patents and Trademarks